(12) United States Patent
Mun

(10) Patent No.: US 11,658,240 B2
(45) Date of Patent: May 23, 2023

(54) SEMICONDUCTOR TRANSISTORS ON MULTI-LAYERED SUBSTRATES

(71) Applicant: GLOBALFOUNDRIES Singapore Pte. Ltd., Singapore (SG)

(72) Inventor: Bong Woong Mun, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 131 days.

(21) Appl. No.: 17/062,625

(22) Filed: Oct. 4, 2020

(65) Prior Publication Data
US 2022/0109069 A1   Apr. 7, 2022

(51) Int. Cl.
| H01L 29/78 | (2006.01) |
| H01L 29/06 | (2006.01) |
| H01L 29/66 | (2006.01) |
| H01L 29/417 | (2006.01) |
| H01L 21/3065 | (2006.01) |
| H01L 29/08 | (2006.01) |

(52) U.S. Cl.
CPC ...... *H01L 29/7816* (2013.01); *H01L 21/3065* (2013.01); *H01L 29/0653* (2013.01); *H01L 29/0886* (2013.01); *H01L 29/4175* (2013.01); *H01L 29/66681* (2013.01)

(58) Field of Classification Search
CPC ............. H01L 29/7816; H01L 21/3065; H01L 29/0653; H01L 29/0886; H01L 29/4175; H01L 29/66681
See application file for complete search history.

(56) References Cited

U.S. PATENT DOCUMENTS

| 7,253,068 B1 | 8/2007 | Ju et al. |
| 7,285,480 B1 | 10/2007 | Joshi et al. |
| 9,922,868 B2 | 3/2018 | Toh et al. |
| 10,056,481 B2 | 8/2018 | Schippel et al. |
| 2019/0288066 A1* | 9/2019 | Lee ........................ H01L 29/402 |
| 2020/0119189 A1* | 4/2020 | Huang ................ H01L 29/0611 |

FOREIGN PATENT DOCUMENTS

JP    2017507502 A    3/2017

OTHER PUBLICATIONS

Chia-Sung Chiu et al., Capacitance Characteristics Improvement and Power Enhancement for RF LDMOS Transistors Using Annular Layout Structure, IEEE Transactions on Microwave Theory and Techniques, Mar. 2011, pp. 638-643, vol. 59, No. 3, IEEE.
Yashvir Singh et al., High figure-of-merit SOI power LDMOS for power integrated circuits, Engineering Science and Technology, 2015, pp. 141-149, vol. 18, Issue 2, Elsevier.

* cited by examiner

*Primary Examiner* — Mohammed R Alam
(74) *Attorney, Agent, or Firm* — David Cain

(57) ABSTRACT

A semiconductor device is provided, which includes a multi-layered substrate, a first doped region, a second doped region, and a gate structure. The multi-layered substrate has a device layer over an isolation layer and the device layer includes a first region having a first substrate thickness and a second region having a second substrate thickness that is lesser than the first substrate thickness. The first doped region is in the first region and the second doped region is in the second region. The gate structure is between the first and second doped regions.

17 Claims, 11 Drawing Sheets

SEMICONDUCTOR TRANSISTORS ON MULTI-LAYERED SUBSTRATES

FIELD OF THE INVENTION

The disclosed subject matter relates generally to semiconductor devices, and more particularly to semiconductor transistors on multi-layered substrates and methods of forming the same.

BACKGROUND

In modern societies, extensive use of electricity has enabled various uses of semiconductor devices in electronic circuits. In particular, transistors are a common type of semiconductor active devices and are often used as amplifiers and switches. Transistors may be used in different applications, such as low or high-frequency applications, as well as low, medium, or high power applications.

Presence of parasitic components, such as parasitic inductance, capacitance, conductance, and resistance, may combine to attenuate and degrade the device performances of those transistors. It is critical to ensure that the parasitic components be kept low, or at least at an acceptable level, for a specific application.

One of the possible solutions to reducing the parasitic components is to fabricate transistors on a silicon-on-insulator substrate. The silicon-on-insulator substrate is able to lower parasitic interactions between the transistors and the bulk semiconductor substrate, thereby achieving an improved device performance as compared to that of transistors formed on a bulk semiconductor substrate.

As the semiconductor industry continues to progress, it is desirable to provide further device performance improvements to semiconductor transistors and methods of forming the same.

SUMMARY

To achieve the foregoing and other aspects of the present disclosure, semiconductor transistors on multi-layered substrates and methods of forming the same are presented.

According to an aspect of the present disclosure, a semiconductor device is provided, which includes a multi-layered substrate, a first doped region, a second doped region, and a gate structure. The multi-layered substrate has a device layer over an isolation layer and the device layer includes a first region having a first substrate thickness and a second region having a second substrate thickness that is lesser than the first substrate thickness. The first doped region is in the first region and the second doped region is in the second region. The gate structure is between the first and second doped regions.

According to another aspect of the present disclosure, a semiconductor device is provided, which includes a multi-layered substrate, a gate structure, a first doped region, and a second doped region. The multi-layered substrate has a device layer over an isolation layer and the gate structure is over the device layer. The first and second doped regions are in the device layer and are adjacent to and on opposing sides of the gate structure. The first doped region has a bottom surface that is above a bottom surface of the second doped region.

According to yet another aspect of the present disclosure, a method of forming a semiconductor device is provided, which includes providing a multi-layered substrate having a device layer over an isolation layer and forming a gate structure over a first region of the device layer having a first substrate thickness. A second region of the device layer having a second substrate thickness is formed adjacent to the gate structure such that the second substrate thickness that is lesser than the first substrate thickness.

BRIEF DESCRIPTION OF THE DRAWINGS

The embodiments of the present disclosure will be better understood from a reading of the following detailed description, taken in conjunction with the accompanying drawings.

Figure 1:
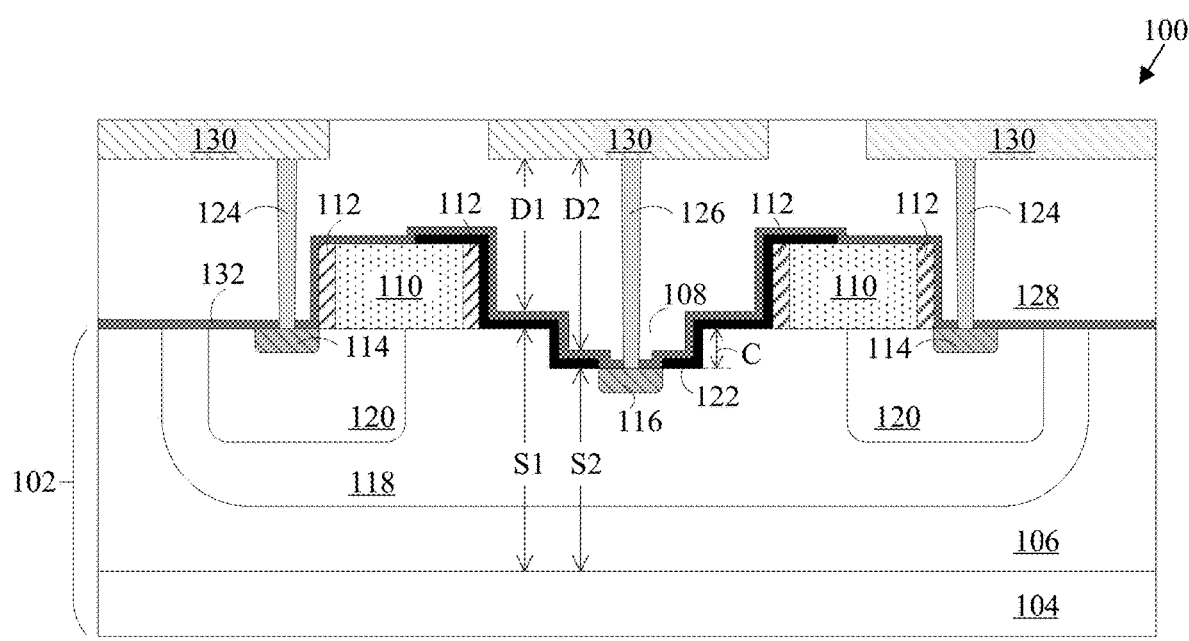
FIG. 1 is a cross-sectional view of a semiconductor device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to semiconductor transistors on multi-layered substrates and methods of forming the same.

In general, multi-layered substrates may be used in place of bulk semiconductor substrates to improve device performances of active devices formed thereupon. A multi-layered substrate may include an insulator layer arranged between a thin semiconductor device layer and a bulk substrate. Known multi-layered substrates may include a silicon-on-insulator substrate, a germanium-on-insulator substrate, or a silicon-on-sapphire substrate.

Electrical interactions between the active devices and the bulk substrate may lead to detrimental parasitic effects. The insulator layer of a multi-layered substrate advantageously reduces those electrical interactions, in particular parasitic capacitance, by providing electrical isolation from the bulk substrate.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure. Certain structures may be conventionally fabricated, for example, using known processes and techniques, and specifically disclosed processes and methods may be used to achieve individual aspects of the present disclosure.

FIG. 1 is a cross-sectional view of a semiconductor device 100, according to an embodiment of the disclosure. The semiconductor device 100 may be part of a semiconductor integrated circuit (IC) device. The semiconductor device 100 may reside in a device region including a plurality of transistors. In this embodiment of the disclosure, the semiconductor device 100 may include a pair of extended-drain metal-oxide-semiconductor field-effect (EDMOS) transistors.

The semiconductor device 100 may be formed upon a multi-layered substrate 102. The multi-layered substrate 102 may include an insulator layer 104 and a semiconductor device layer 106 formed over the insulator layer 104. The insulator layer 104 may include an electrically insulative material such as, but not limited to, silicon dioxide or sapphire. Other electrically insulative materials known in the art are contemplated as being applicable to all embodiments of the present disclosure. The device layer 106 may function as channels for current flow and may include a semiconductor material such as, but not limited to, silicon or germanium. Other semiconductor materials known in the art are contemplated as being applicable to all embodiments of the present disclosure.

A cavity 108 may be formed in the device layer 106, effectuating different regions in the device layer; a first region that does not underlie a cavity and a second region underlying the cavity 108. The cavity 108 does not extend through the device layer 106. The first region has a first upper surface and a first substrate thickness S1 and the second region has a second upper surface and a second substrate thickness S2. The first substrate thickness S1 is greater than the second substrate thickness S2 such that the first upper surface of the first region is above the second upper surface of the second region. The cavity 108 may have a cavity depth C from the first upper surface of the first region of device layer 106.

Gate structures 110 may be formed over the first region of the device layer 106 and each gate structure 110 may include a plurality of elements such as, but not limited to, a gate electrode that is arranged over a gate dielectric layer; these elements are not shown so as to not obscure the present disclosure. Gate spacers 112 may be formed on sidewalls of the gate structures 110. The gate spacers 112 may include a dielectric material such as, but not limited to, silicon oxide, silicon nitride, or the like. The gate spacers 112 may serve to isolate the gate structures 110 from adjacent conductive features. As illustrated in FIG. 1, the cavity 108 may be arranged between the pair of gate structures 110.

A plurality of doped regions 114, 116 may be formed on opposing sides of the gate structures 110 in the device layer 106. In particular, a source region 114 may be formed in the first region of the device layer and a drain region 116 may be formed in the second region of the device layer 106. Although the source and drain regions 114, 116 are being illustrated as having the same form, it is understood that the forms of the source and drain regions may vary depending on the technology node and design requirements of the semiconductor device 100. The drain region 116 may be a shared drain region between the pair of gate structures 110, as illustrated in FIG. 1, In an embodiment of the disclosure, the source region 114 may be formed in the first region of the device layer 106, and the drain region 116 may be formed in the second region of the device layer 106. The drain region 116 may have a lower surface that is below a lower surface of the source region 114. For an exemplary embodiment of an EDMOS transistor, the drain region 116 is formed further from the gate structure 110 than the source region 114 from the gate structure 110.

The semiconductor device 100 may further include a plurality of doped wells 118, 120 in the device layer 106.

The plurality of doped wells 118, 120 may include a first doped well 118 and a second doped well 120. The first doped well 118 may serve as a drift well and the second doped well 120 may serve as a body well for the semiconductor device 100. The dopant concentrations and/or dopant depths of the doped wells 118, 120 in the device layer 106, for example, may vary depending on the technology node and design requirements of the semiconductor device 100.

An insulation layer 122 may be formed partially overlapping upper surfaces of the gate structures 110 and extending towards the drain region 116. The insulation layer 122 may be conformally deposited may not overlay the drain region 116. The insulation layer 122 may be a single-layered dielectric material or a multi-layered dielectric material. For example, the single-layered insulation layer 122 may include silicon oxide. In another example, the multi-layered insulation layer 122 may include a first silicon oxide layer, a silicon nitride layer arranged over the first silicon oxide layer, and a second silicon oxide layer arranged over the silicon nitride layer. In an embodiment of the disclosure, the insulation layer 122 may function as a silicide alignment box (SAB) layer.

A plurality of contacts 124, 126 may be formed in a dielectric layer 128 overlying the device layer 106. The plurality of contacts 124, 126 may include a source contact 124 formed over the source region 114 in the first region of the device layer 106 and a drain contact 126 formed over the drain region 116 in the second region of the device layer 106. The source contact 124 may have a height that is shorter than the drain contact 126.

The plurality of contacts 124, 126 may serve to provide electrical connectivity between the source and drain regions 114, 116 of the semiconductor device 100 and other regions of the semiconductor IC device, such as logic or memory devices, through a plurality of interconnect structures 130. The plurality of interconnect structures 130 may include a via structure, a line structure, or a combination of via and line structures.

The semiconductor device 100 may further include a dielectric liner 132 formed over the device layer 106, overlying the source and drain regions 114, 116, and the gate structures 110. The dielectric liner 132 may be an etch stop layer that serves to provide a relatively high etch selectivity layer, allowing precision in forming features, such as the plurality of contacts 124, 126, advantageously minimizing any potential damage caused to the device layer 106 during the fabrication process. In an embodiment of the disclosure, the dielectric liner 132 may include silicon oxide, silicon nitride, or the like.

An exemplary capacitor has been conceived; the electrically conductive device layer 106 and the interconnect structures 130 having the insulative dielectric layer 128 interposed therebetween. A consequence of having such a capacitor is the formation of parasitic capacitance between the device layer 106 and the interconnect structures 130 around the drain region 116 of the semiconductor device 100. This parasitic capacitance contributes to resistive-capacitive (RC) delay and hence lowers the switching speed of the semiconductor device 100.

The cavity 108 advantageously reduces the parasitic capacitance around the drain region 116 by increasing the separation distance between the device layer 106 and the interconnect structures 130, thereby improving the device performance. The dielectric layer 128 may have a first dielectric thickness D1 over the first region of the device layer 106 and a second dielectric thickness D2 over the second region; the first dielectric thickness D1 being lesser than the second dielectric thickness D2.

It is advantageous to improve parasitic capacitance around the drain region 116 as the parasitic capacitance around the drain region 116 greatly affects the switching speed of the semiconductor device 100. For example, a large parasitic capacitance causes a delay in the rise in drain current after the gate structure is turned on. In another example, a large parasitic capacitance may cause a delay in the fall in drain current after the gate structure is turned on. Therefore, by reducing parasitic capacitance around the drain region 116, the corresponding gate-drain capacitance may, accordingly, be reduced, thereby achieving a faster switching speed and an improved device performance.

FIGS. 2A to 7C are cross-sectional views of a semiconductor device 200, illustrating various stages of forming the semiconductor device 200, according to embodiments of the disclosure. FIGS. 2A to 7C provides an exemplary method for integrating three disparate types of active devices on the same semiconductor device 200.

In particular, FIGS. 2 to 7 having the suffix "A" are cross-sectional views of a first region 232 of the semiconductor device 200 defined to form a first active device 238, figures having the suffix "B" are cross-sectional views of a second region 234 of the semiconductor device 200 defined to form a second active device 240, and figures having the suffix "C" are cross-sectional views of a third region 236 of the semiconductor device 200 defined to form a third active device 242. In this embodiment of the disclosure, the first active device 238 may be an asymmetrical complementary-metal-oxide-semiconductor (CMOS) transistor, the second active device 240 may be an extended-drain metal-oxide-semiconductor (EDMOS) transistor, and the third active device 242 may be a laterally-diffused metal-oxide-semiconductor (LDMOS) transistor.

The semiconductor device 200 may be part of a semiconductor IC device and may include a multi-layered substrate 102. The multi-layered substrate 102 may include an insulator layer 104 and a semiconductor device layer 106 formed over the insulator layer 104. The device layer 106 may have a first substrate thickness S1.

Figure 2A:
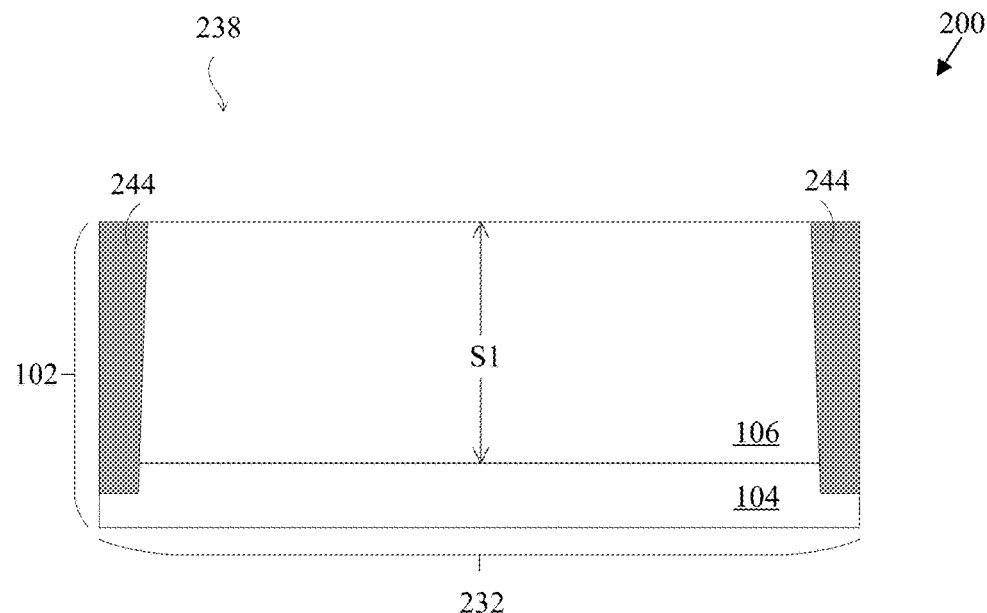
FIGS. 2A to 7C are cross-sectional views of a semiconductor device, illustrating a method of integrating three disparate types of active devices on the same semiconductor device, according to an embodiment of the disclosure.
Figure 2B:
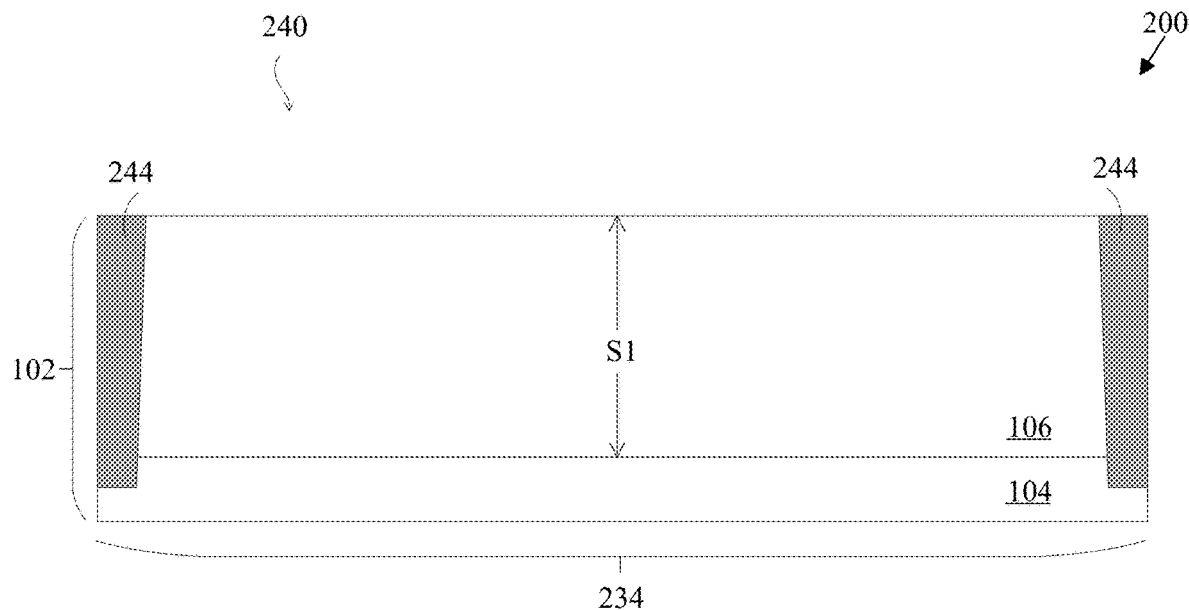
Figure 2C:
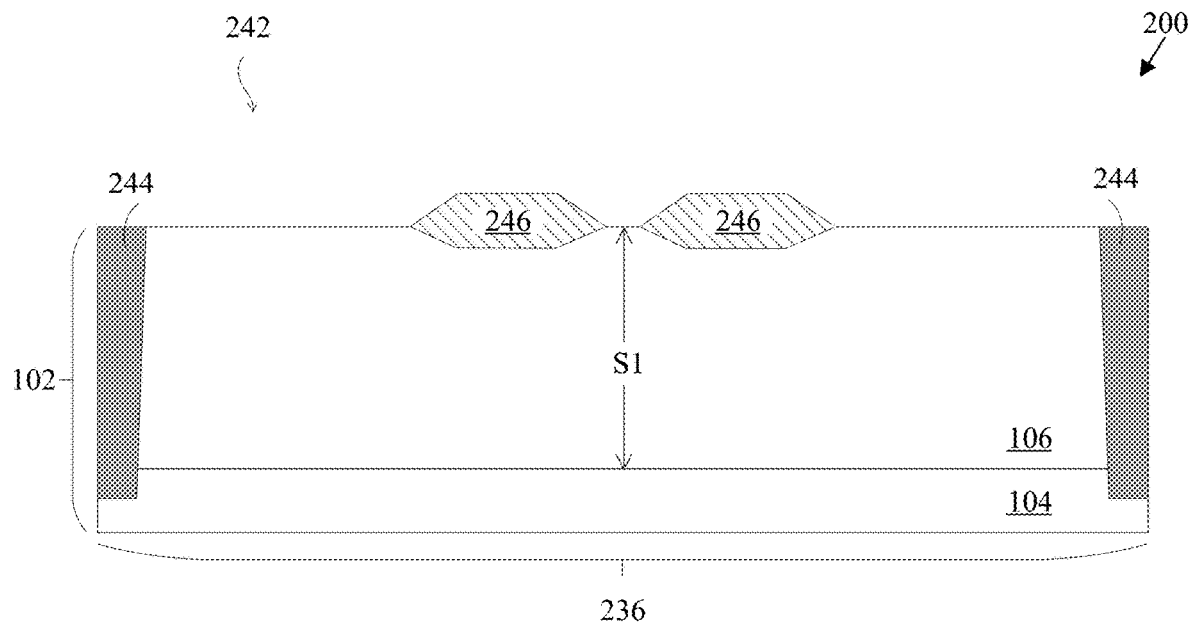

FIGS. 2A to 2C illustrate the semiconductor device 200 after forming a plurality of isolative features 244, 246. The plurality of isolative features 244, 246 may be provided in the multi-layered substrate 102 and may include a dielectric material that is suitable to at least electrically isolate adjacent conductive features from each other. The dielectric material may include, but not limited to, silicon dioxide. Other dielectric materials known in the art may also be employed. The plurality of isolative features 244, 246 may include inter-device isolation regions 244 and intra-device isolation regions 246.

Inter-device isolation regions 244 may be provided for electrically isolating or separating the different regions 232, 234, 236 of the semiconductor device 200, as illustrated in FIGS. 2A to 2C. The inter-device isolation regions 244 may extend through the device layer 106. The inter-device isolation regions 244 may include a dielectric material that is suitable to at least electrically isolate the different regions of the semiconductor device 200 from each other. The inter-device isolation regions 244 may include deep trench isolation (DTI) regions or the like.

Intra-device isolation regions 246 may be provided for electrical performance consideration. For example, as illustrated in FIG. 2C, the intra-device isolation regions 246 may be provided in the third region 236 of the semiconductor device 200 for the third active device 242 that is designed for high-voltage applications. The intra-device isolation region 246 may include a shallow trench isolation (STI) region or the like.

Figure 3A:
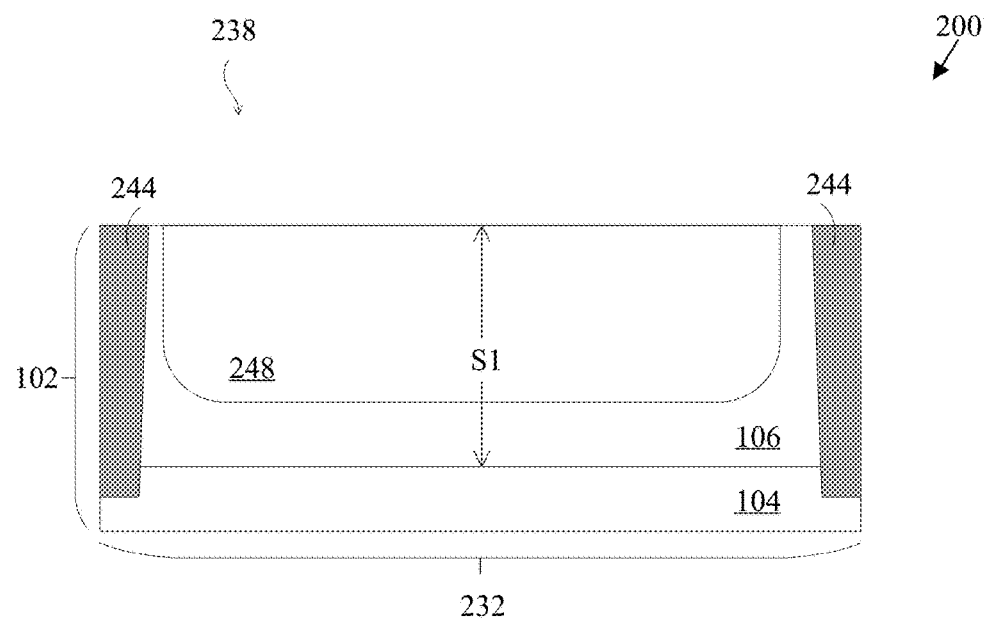
Figure 3B:
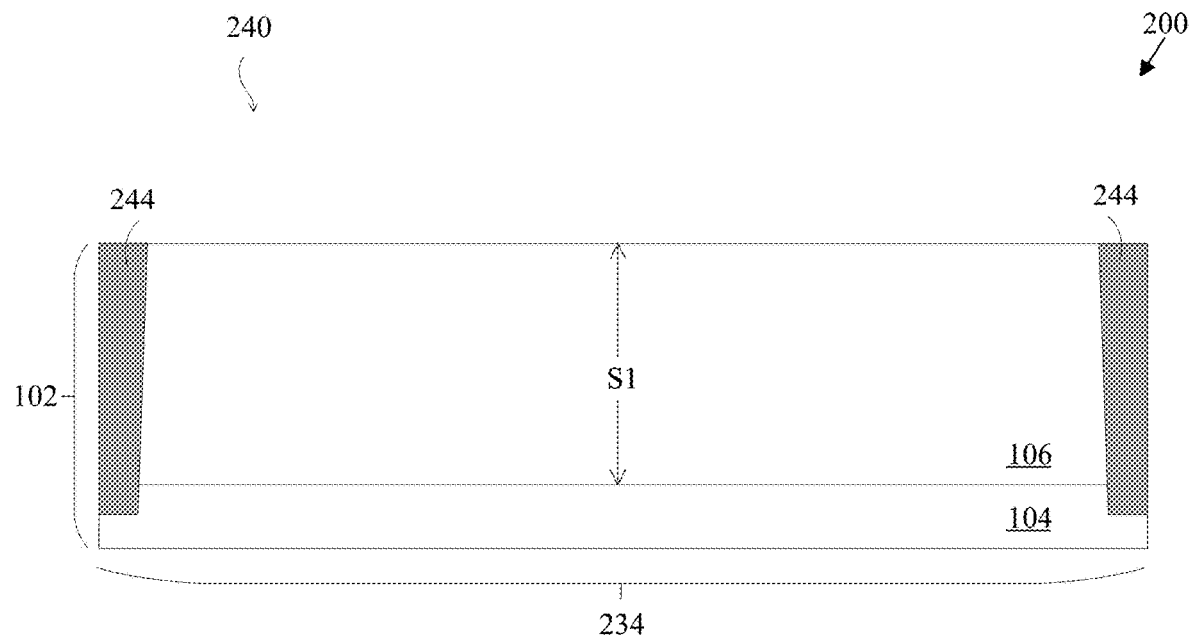
Figure 3C:
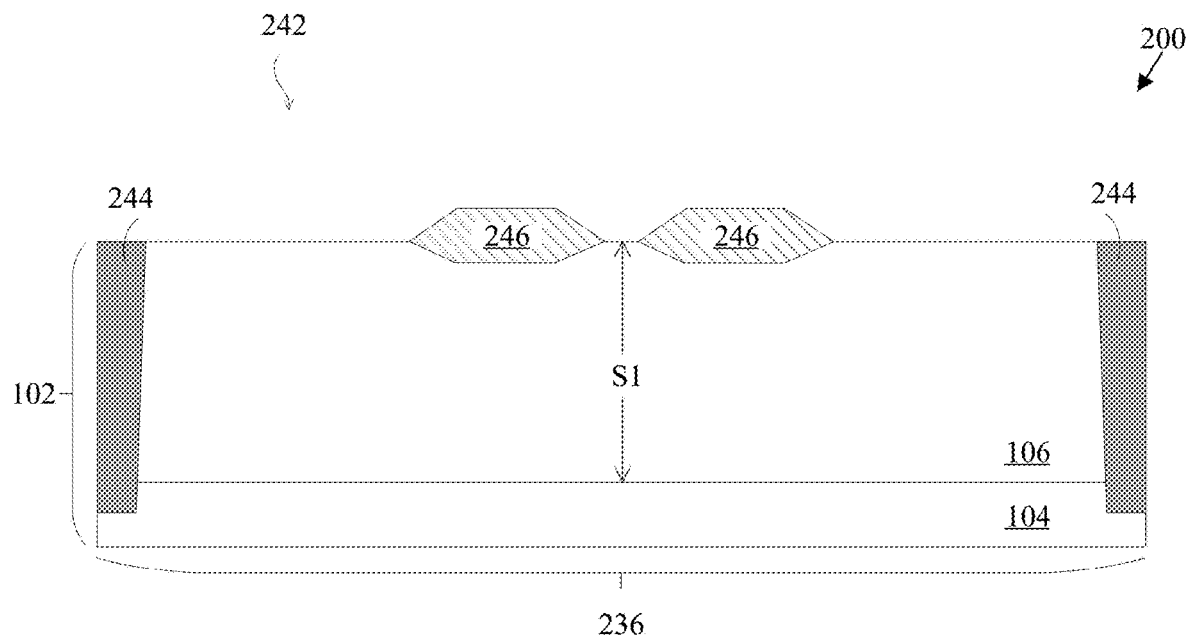

FIGS. 3A to 3C (FIG. 3A continues from FIG. 2A, FIG. 3B continues from FIG. 2B, and FIG. 2C continues from FIG. 2C) illustrate the semiconductor device 200 after forming a conductive well 248, according to an embodiment of the disclosure. The conductive well 248 may be provided depending on the design requirements of the active devices. For example, the conductive well 248 may be provided in the first region 232 of the semiconductor device 200 for the first active device 238, as illustrated in FIG. 3A. The conductive well 248 may be formed by introducing dopants into the device layer 106. The dopant concentrations and/or dopant depths may vary depending on the technology node and design requirements for the first active device 238. In an embodiment of the disclosure, the conductive well 248 may serve as a logic well for the first active device 238.

Figure 4A:
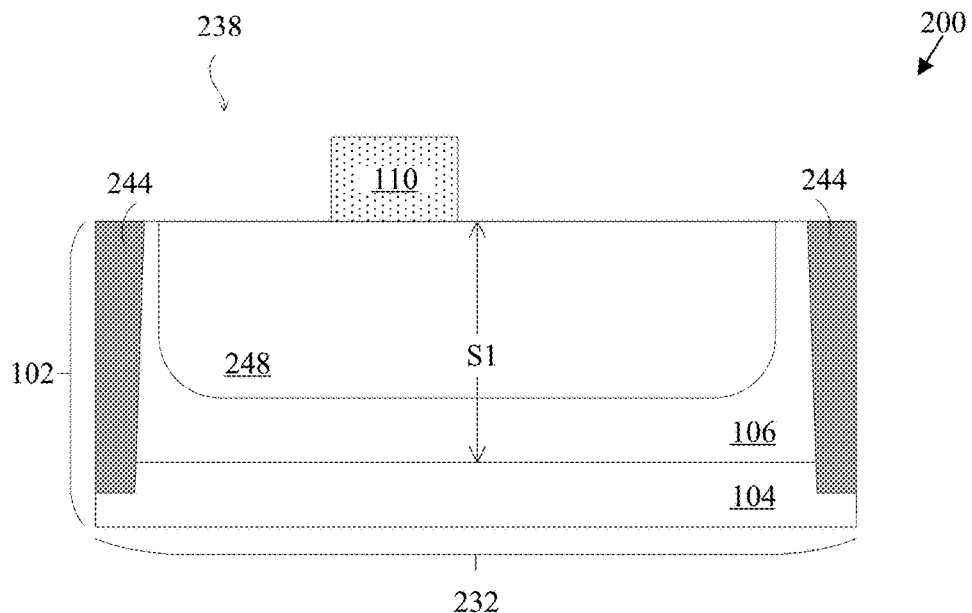
Figure 4B:
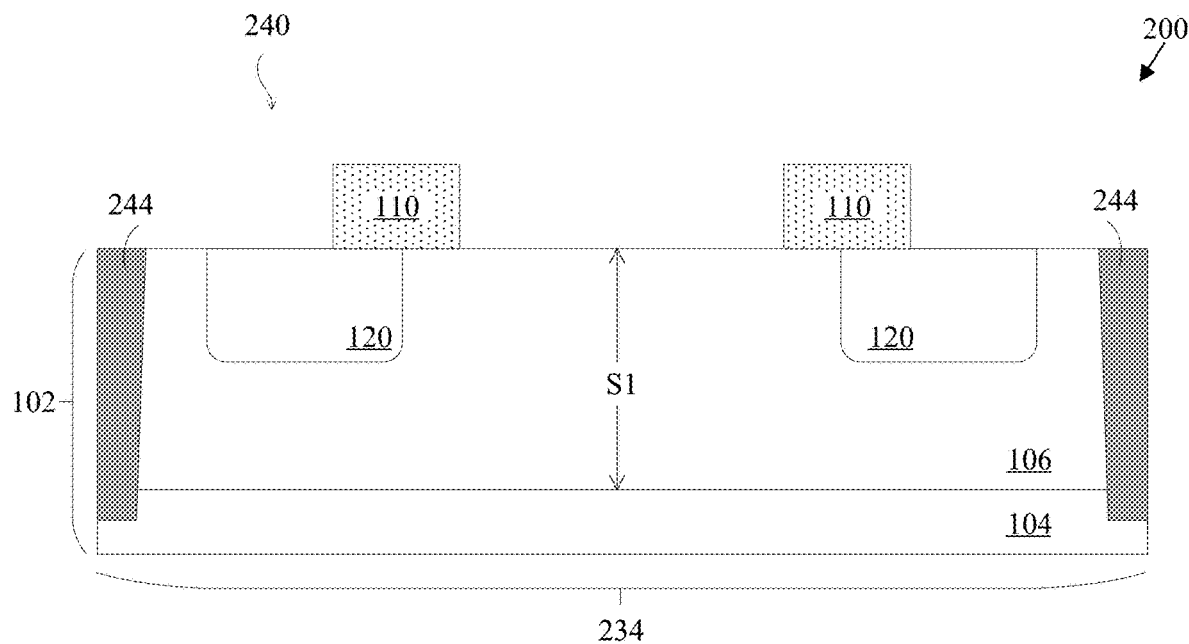
Figure 4C:
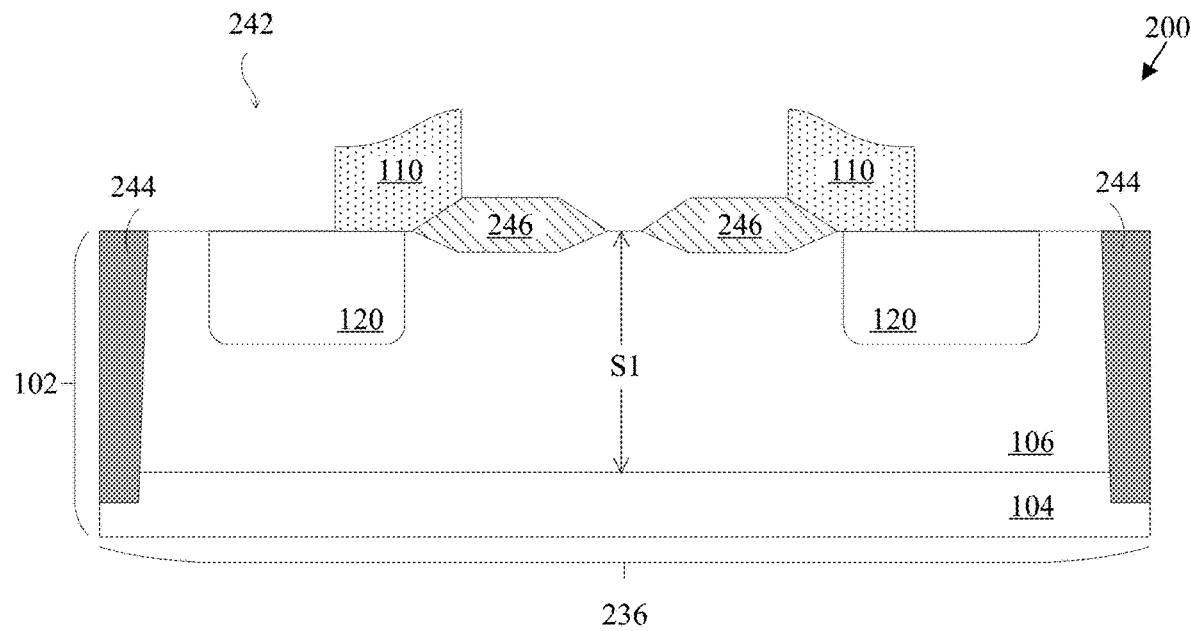

FIGS. 4A to 4C (FIG. 4A continues from FIG. 3A, FIG. 4B continues from FIG. 3B, and FIG. 4C continues from FIG. 3C) illustrate the semiconductor device 200 after forming gate structures 110 and doped wells 120, according to an embodiment of the disclosure. The gate structures 110 may be formed over an upper surface of the device layer 106 and each gate structure 110 may include a plurality of elements such as, but not limited to, a gate electrode that is arranged over a gate dielectric layer, these elements are not shown so as to not obscure the present disclosure.

The doped wells 120 may be provided depending on the design requirements of the active devices, for example, the doped wells 120 may be provided for the second and third active device 240, 242 in the second and third regions 234, 236 of the semiconductor device 200, as illustrated in FIGS. 4B and 4C, respectively. The doped wells 120 may be formed by introducing dopants into the device layer 106. The dopants in the plurality of doped wells 120 may or may not include the same type of dopants as the conductive well 248 in the first region 232 of the semiconductor device 200. The dopant concentrations and/or dopant depths may vary depending on the technology node and design requirements for the second and third active devices, respectively. In an embodiment of the disclosure, the doped wells 120 may serve as body wells for the second and third active devices 240, 242.

Figure 5A:
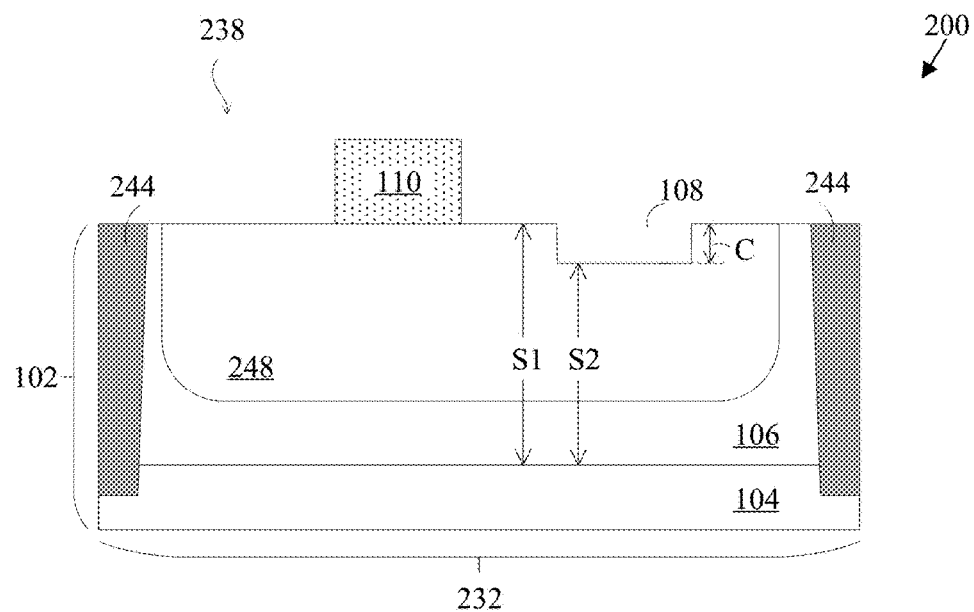
Figure 5B:
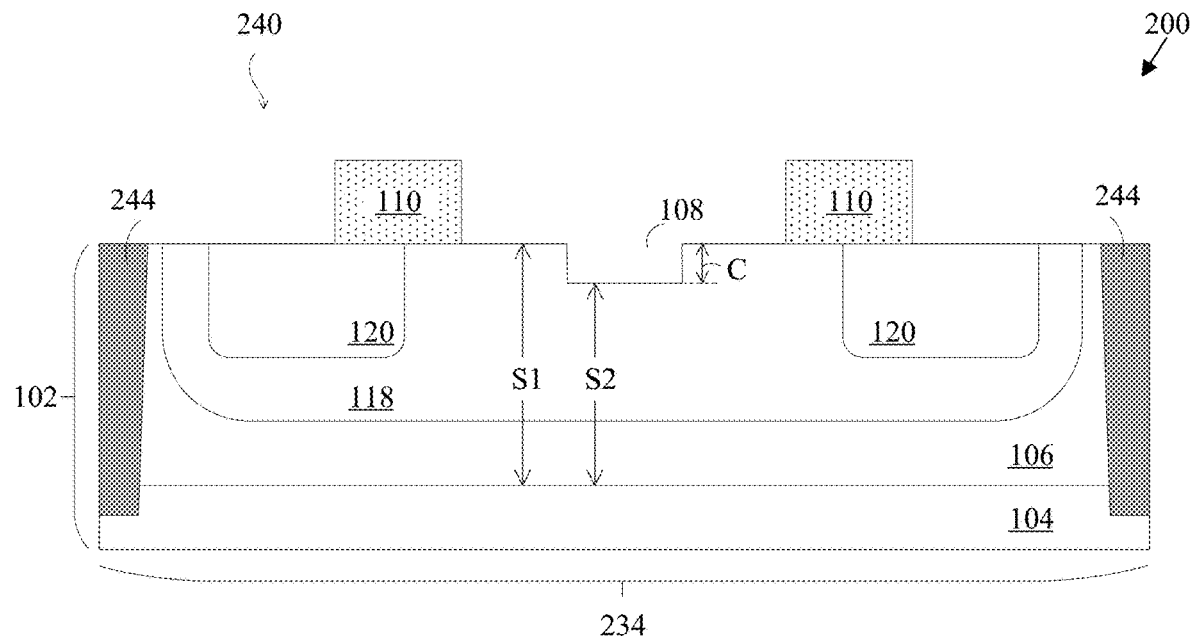
Figure 5C:
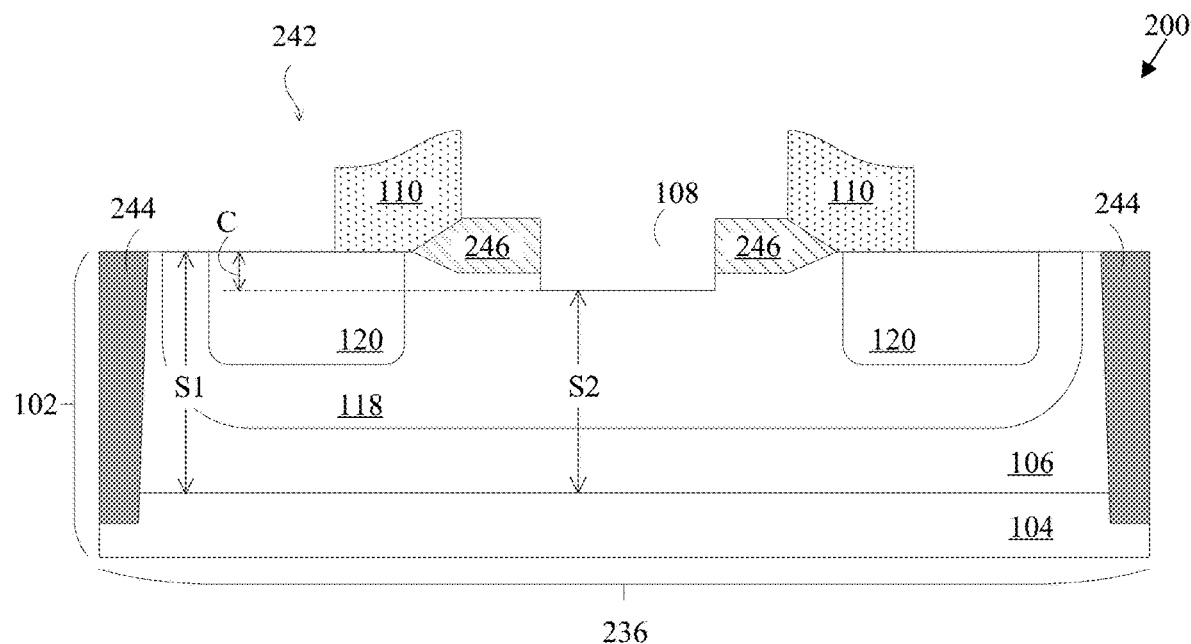

FIGS. 5A to 5C (FIG. 5A continues from FIG. 4A, FIG. 5B continues from FIG. 4B, and FIG. 5C continues from FIG. 4C) illustrate the semiconductor device 200 after forming cavities 108 in the device layer 106, according to an embodiment of the disclosure. The cavities 108 may be arranged over drain regions of the active devices that will be subsequently formed. The cavities 108 may have a cavity depth C from the upper surface of the device layer 106. It is understood that the cavities 108 in FIGS. 5A to 5C may not necessarily have the same cavity depth C or width. The depths C and widths of the cavities may vary depending on the design requirements for the active devices.

The formation of the cavities 108 has effectuated varying thicknesses of the device layer 106. In particular, the portions of the device layer 106 underlying the cavities 108 have a second substrate thickness S2, while other portions of the device layer 106 that do not underlay a cavity maintain the first substrate thickness S1; the second substrate thickness S2 being lesser than the first substrate thickness S1.

In an embodiment of the disclosure, the cavities 108 may be formed by an exemplary patterning technique described herein. A patterning layer (not shown) may be deposited over the multi-layered substrate 102 and the gate structures 110. The patterning layer may include a patternable material such as, but not limited to, a photoresist layer, a hard mask layer, or a combination thereof. Openings (not shown) may be formed in the patterning layer using a patterning process, exposing portions of the upper surface of the device layer 106.

The openings in the patterning layer may be extended into the device layer 106 of the multi-layered substrate 102 to form the cavities 108 using a material removal process. A suitable material removal process may include an anisotropic dry etching process, such as a reactive ion etching (RIE) process. The patterning layer may be removed by another material removal process after forming the cavities 108.

Doped wells 118 may be provided depending on the design requirements of the active devices. For example, the doped wells 118 may be formed in the device layer 106 for the second and third active devices 240, 242, as illustrated in FIGS. 5B and 5C, respectively. In an embodiment of the disclosure, the doped wells 118 may serve as drift wells for the second and third active devices 240, 242 and may be formed by introducing dopants into the device layer 106 at the second and third regions 234, 236 of the semiconductor device 200.

Figure 6A:
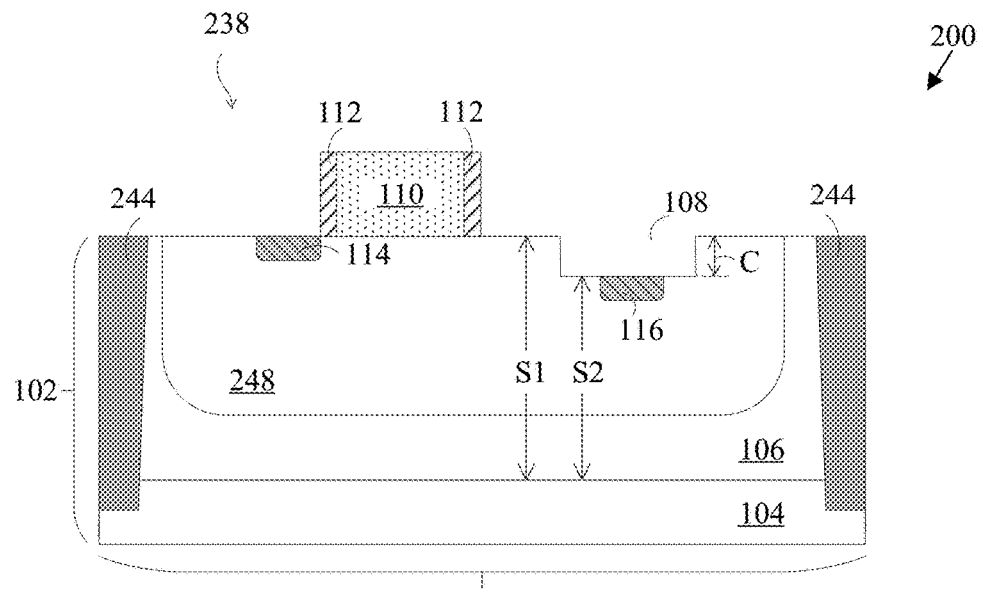
Figure 6B:
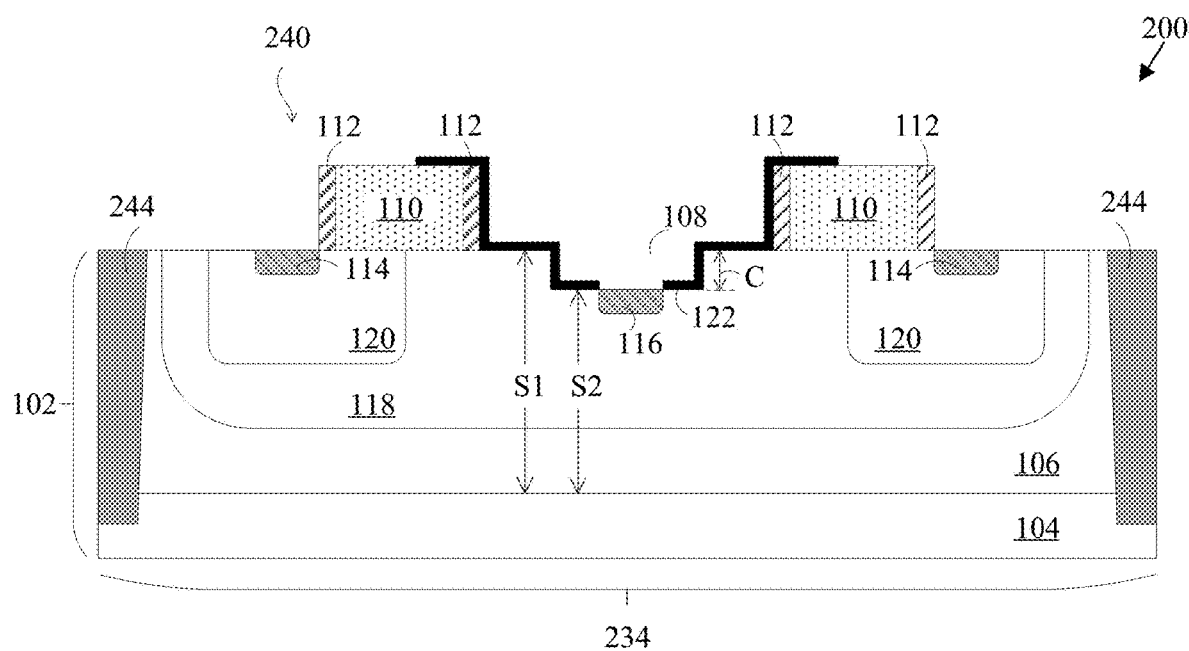
Figure 6C:
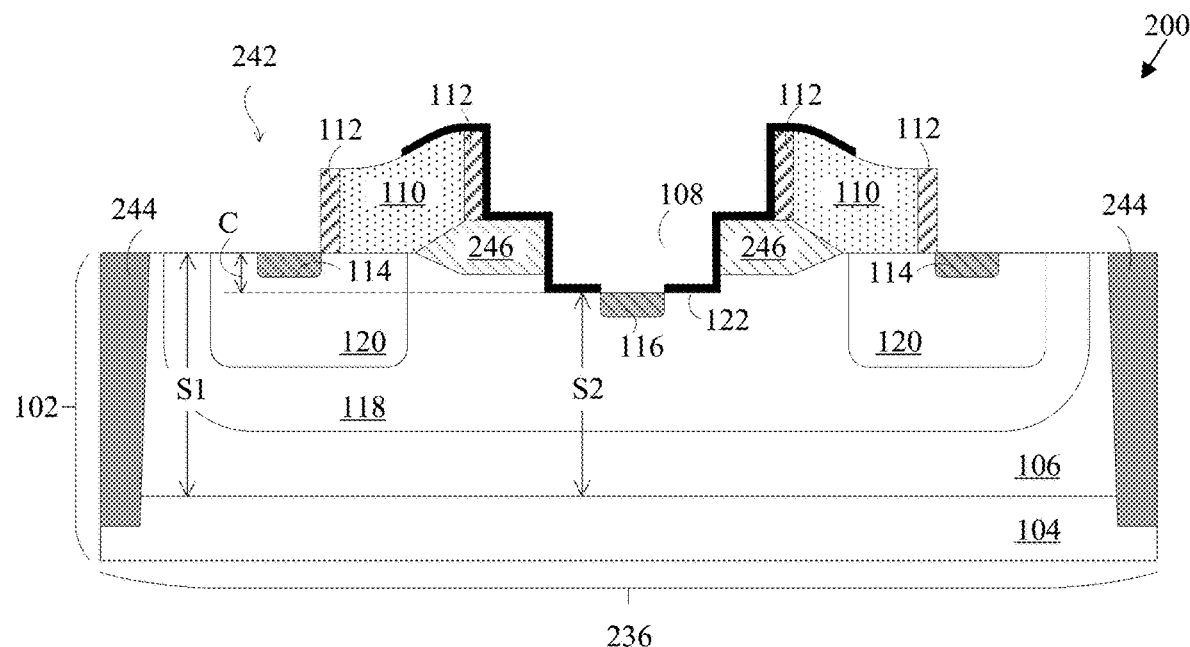

FIGS. 6A to 6C (FIG. 6A continues from FIG. 5A, FIG. 6B continues from FIG. 5B, and FIG. 6C continues from FIG. 5C) illustrate the semiconductor device 200 after forming gate spacers 112, source regions 114, drain regions 116, and insulation layers 122, according to an embodiment of the disclosure. The gate spacers 112 may be fabricated on sidewalls of the gate structures 110. The gate spacers 112 may serve to isolate gate structures 110 from adjacent conductive features.

The source and drain regions 114, 116 may be formed by introducing dopants into the device layer 106. The drain regions 116 may be arranged adjacent to the respective gate structures 110 in the device layer 106 that is underlying the plurality of cavities 108. The source regions 114 may be arranged in the device layer 106 at opposing sides of the gate structures 110 from the drain regions 116.

The gate spacers 112 and the insulation layers 122 may be formed by the various deposition and patterning processes. The gate spacers 112 may be deposited on sidewalls of the gate structures 110. It may be preferable to employ a conformal deposition process to form the gate spacers 112. The conformal deposition process may include, but not limited to, an ALD process or a highly-conformal CVD process to deposit a spacer material. The spacer material may be patterned to form the gate spacers 112.

Similar to the fabrication process of the gate spacers 112, a conformal deposition process may be preferable to form the insulations layer 122. An insulating material may be deposited and patterned to form the insulation layers 122 that partially overlap upper surfaces of the gate structures 110 and extend towards the drain regions 116. As illustrated in FIGS. 6B and 6C, the insulation layers 122 may be formed in the second and third regions 234, 236 of the semiconductor device 200 and may not overlay the drain regions 116, according to the design requirements of the second and third active devices 240, 242. In an embodiment of the disclosure, the insulation layers 122 may function as silicide alignment box (SAB) layers.

Figure 7A:
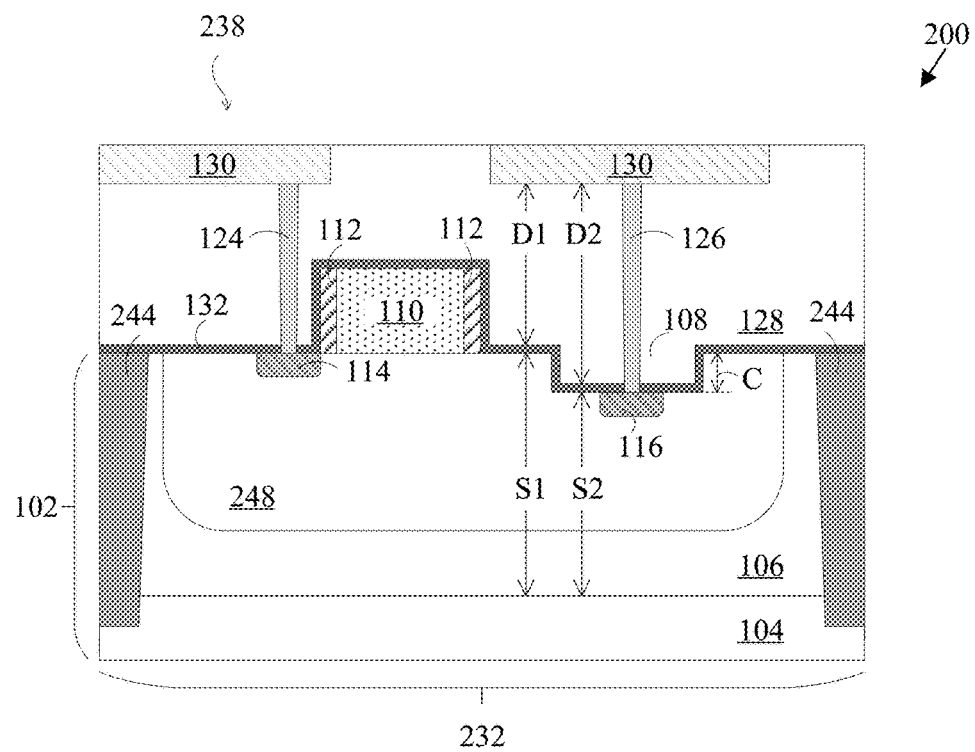
Figure 7B:
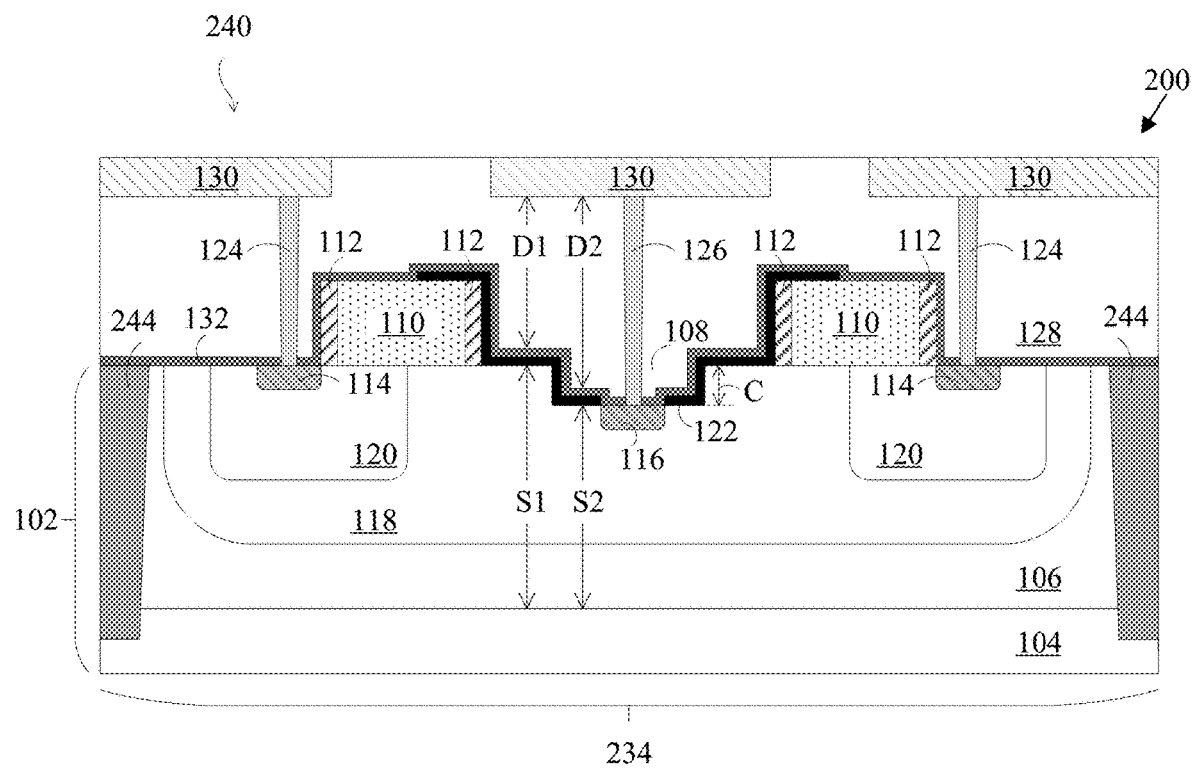
Figure 7C:
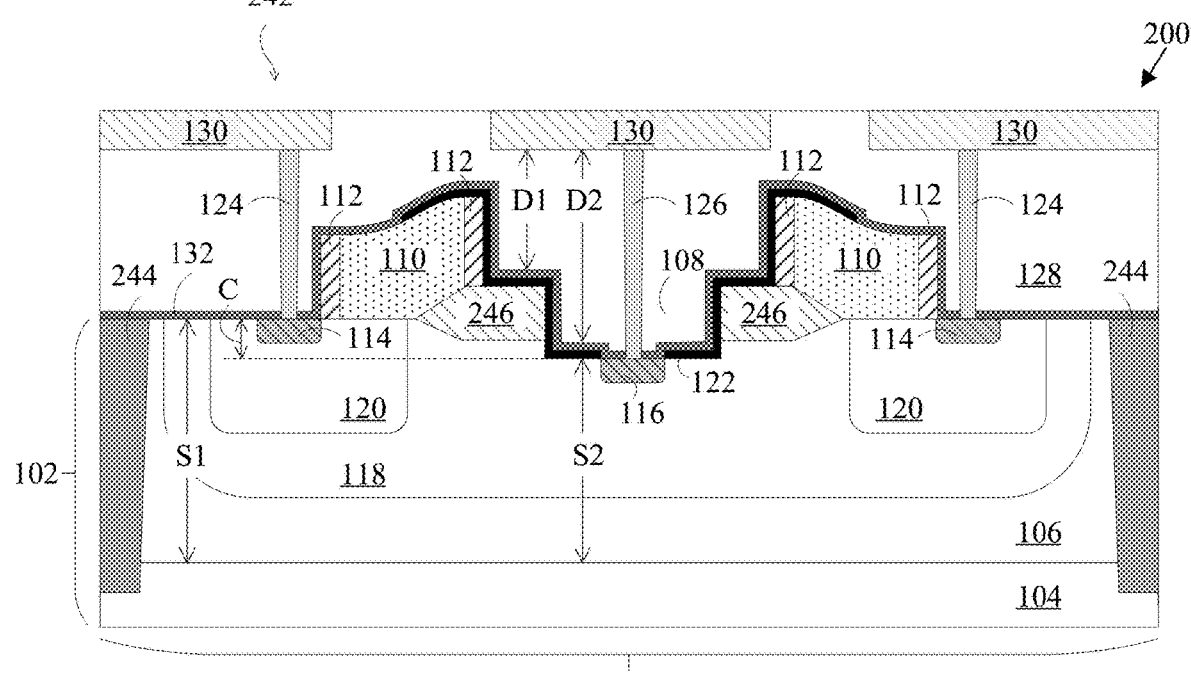

FIGS. 7A to 7C (FIG. 7A continues from FIG. 6A, FIG. 7B continues from FIG. 6B, and FIG. 7C continues from FIG. 6C) illustrate the semiconductor device 200 after forming a dielectric liner 132, according to an embodiment of the disclosure. The dielectric liner 132 may be deposited over the device layer 106, overlying the source and drain regions 114, 116, and the gate structures 110. The dielectric liner 132 may be an etch stop layer that serves to provide a relatively high etch selectivity layer, allowing precision in forming features, such as a plurality of contacts 124, 126 over the multi-layered substrate 102, thereby minimizing any potential damage caused to the device layer 106. In an embodiment of the disclosure, the dielectric liner 132 may be silicon oxide, silicon nitride, or the like.

A dielectric layer 128 may be formed over the dielectric liner 132. The dielectric layer 128 overlying the dielectric liner 132 may have varying thicknesses. In particular, the dielectric layer 128 over the portions of the device layer 106 having the first substrate S1 may have a first dielectric thickness D1 and over the portions of the device layer 106 having the second substrate S2 may have a second dielectric thickness D2; the first dielectric thickness D1 being lesser than the second dielectric thickness D2.

The semiconductor device 200 may undergo further processing steps to form various features known in the art, such as contacts 124, 126 and interconnect structures 130. The contacts 124, 126 may be formed to establish an electrical connection between the source and drain regions 114, 116 and the back-end-of-line (BEOL) regions of the semiconductor device 200. The portions of the dielectric layer 128 having the greater dielectric thickness D2 advantageously reduces the parasitic capacitance between the device layer 106 and the interconnect structures 130, thereby improving the switching speed and device performance of the semiconductor device 200.

Figure 8:
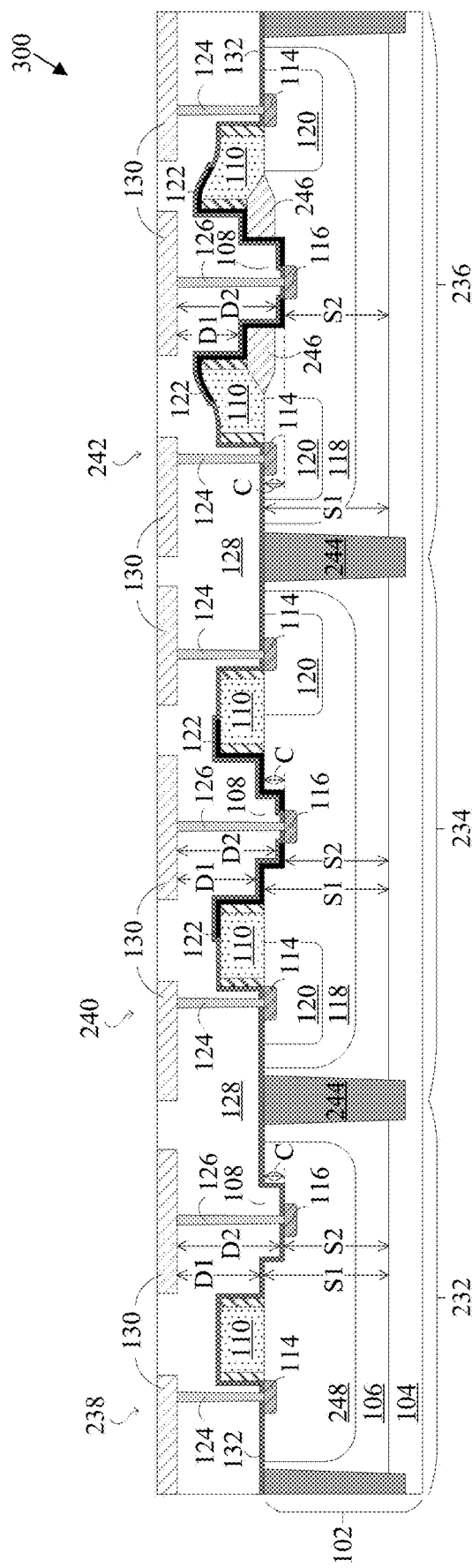
FIG. 8 is a cross-sectional view of a semiconductor device having three disparate types of active devices, according to an embodiment of the disclosure.

FIG. 8 is a cross-sectional view of a semiconductor device 300 having three disparate types of active devices integrated together, according to an embodiment of the disclosure. The semiconductor device 300 may be part of a semiconductor integrated circuit (IC) device. The semiconductor device 300 may reside in a device region including a plurality of transistors.

The semiconductor device 300 may be fabricated using the method described in FIGS. 2A to 7C. The semiconductor device 300 may have a first region 232 defined to form a first active device 238, a second region 234 defined to form a second active device 240, and a third region 236 defined to form a third active device 242. The first, second, and third regions 232, 234, 236 may be electrically isolated or separated from each other using inter-device isolation regions 244. In an embodiment of the disclosure, the inter-device isolation regions 244 may include deep trench isolation (DTI) regions or the like.

In this embodiment of the disclosure, the first active device 238 may be an asymmetrical complementary-metal-oxide-semiconductor (CMOS) transistor, the second active device 240 may be an extended-drain metal-oxide-semiconductor (EDMOS) transistor, and the third active device 242 may be a laterally-diffused metal-oxide-semiconductor (LDMOS) transistor.

It should be appreciated by those skilled in the art that the embodiment having an integrated CMOS transistor, an integrated EDMOS transistor, and an integrated LDMOS transistor is only an exemplary example, and is not intended to limit the scope of the disclosure. Rather, the above detailed description will provide a convenient road map for implementation with other types of transistors without departing from the spirit and scope of the present disclosure.

As presented in the above disclosure, semiconductor transistors on a multi-layered substrate and methods of forming the same are presented. The multi-layered substrate may have a device layer over an insulator layer. The transistors may achieve a significant reduction in parasitic capacitance around their respective drain regions by forming cavities in the device layer. The regions of the device layer underlying the cavities are thinner than those regions not underlying the cavities.

A dielectric layer formed over the device layer may have a greater thickness over the thinner regions of the device layer. The wider separation distance between the device layer and overlying interconnect structures advantageously reduces the parasitic capacitance of the transistors, thereby achieving improved transistor device performances.

Table 1 below illustrates an exemplary set of simulated data based on a transistor formed over a multi-layered substrate having a dielectric layer of varying dielectric thicknesses D2, illustrating the potential parasitic capacitance reduction with varying thicknesses of the dielectric layer D2/varying cavity depths C.

| Substrate Thickness, S1 | 15000 Å | 15000 Å |
| --- | --- | --- |
| Dielectric Thickness, D1 | 5500 Å | 5500 Å |
| Cavity Depth, C | 1000 Å | 2000 Å |
| Dielectric Thickness, D2 | 6500 Å | 7500 Å |
| Capacitance Reduction | 15 % | 27% |

Furthermore, by using the methods disclosed herein, designers have increased design flexibility and may selectively integrate disparate types of transistors on the same semiconductor device. Exemplary embodiments of an asymmetrical CMOS transistor, an EDMOS transistor, and an LDMOS transistor have been presented above. Thus, a semiconductor device may be tailored to achieve improved device performances and take advantage of the different strengths of the transistors of these different disparate technologies.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device, comprising:
    a multi-layered substrate having a device layer over an insulator layer, the device layer including:
        a first region having a first substrate thickness; and
        a second region having a second substrate thickness that is lesser than the first substrate thickness;
    a first doped region in the first region of the device layer;
    a second doped region in the second region of the device layer; and
    a planar gate structure between the first doped region and the second doped region, the planar gate structure is over the first region and spaced from the second region of the device layer.

2. The semiconductor device of claim 1, further comprising a dielectric layer over the device layer, the dielectric layer comprising:
    a first portion having a first dielectric thickness over the first region of the device layer, the first portion completely covers the planar gate structure; and
    a second portion having a second dielectric thickness over the second region of the device layer, wherein the first dielectric thickness is lesser than the second dielectric thickness.

3. The semiconductor device of claim 1, further comprising a first contact over the first doped region and a second contact over the second doped region, the first contact having a height that is shorter than a height of the second contact.

4. The semiconductor device of claim 1, wherein the second doped region is a drain region of the semiconductor device.

5. The semiconductor device of claim 1, wherein the second doped region is positioned further from the planar gate structure than the first doped region from the planar gate structure.

6. The semiconductor device of claim 5, wherein the semiconductor device is an extended-drain metal-oxide-semiconductor transistor.

7. The semiconductor device of claim 1, further comprising an insulation layer partially overlapping an upper surface of the planar gate structure and extending towards the second region of the device layer.

8. A semiconductor device, comprising:
    a multi-layered substrate having a device layer over an insulator layer, the device layer including:
        a first region having a first substrate thickness; and
        a second region having a second substrate thickness that is lesser than the first substrate thickness;
    a planar gate structure over the first region and spaced from the second region of the device layer;

a first doped region in the first region of the device layer;

a second doped region in the second region of the device layer, the first doped region and the second doped region are adjacent to and on opposing sides of the planar gate structure, wherein the first doped region has a bottom surface that is above a bottom surface of the second doped region; and an insulation layer, the insulation layer comprises:

a first portion over the first region of the device layer, the first portion partially overlapping an upper surface of the planar gate structure; and a second portion over the second region of the device layer.

9. The semiconductor device of claim 8, wherein the first doped region is at a first region of the device layer and the second doped region is at a second region of the device layer, the first region having an upper surface above an upper surface of the second region.

10. The semiconductor device of claim 8, further comprising a first contact over the first doped region and a second contact over the second doped region, wherein the first contact has a bottom surface that is above a bottom surface of the second contact.

11. The semiconductor device of claim 8, wherein the first doped region is in a thicker device layer than the second doped region.

12. A method of forming a semiconductor device, comprising:

forming a planar gate structure over a first region of a device layer of a multi-layered substrate, the device layer is over an insulator layer and has a first substrate thickness at the first region thereof;

forming a second region of the device layer having a second substrate thickness adjacent to the first region, wherein the planar gate structure is spaced from the second region and the second substrate thickness is lesser than the first substrate thickness; and forming an insulation layer having a first portion over the first region and a second portion over the second region of the device layer, the first portion partially overlaps an upper surface of the planar gate structure.

13. The method of claim 12, wherein forming the second region of the device layer comprises forming a cavity in the device layer.

14. The method of claim 13, wherein the cavity is formed using a patterning technique.

15. The method of claim 12, further comprising:

forming a first doped region in the first region of the device layer adjacent to the planar gate structure; and forming a second doped region in the second region of the device layer, wherein the first doped region has a bottom surface above a bottom surface of the second doped region.

16. The method of claim 13, wherein forming the second portion of the insulation layer comprises:

forming the second portion of the insulation layer over sidewalls and a bottom surface of the cavity.

17. The method of claim 12, further comprising:

depositing a dielectric layer over the first region and the second region of the device layer, wherein the dielectric layer has a first portion of a first dielectric thickness over the first region and a second portion of a second dielectric thickness over the second region, the first dielectric thickness is greater than the second dielectric thickness, wherein the first portion of the dielectric layer completely covers the planar gate structure.

\* \* \* \* \*